US008115720B2

(12) United States Patent
Choi

(10) Patent No.: US 8,115,720 B2
(45) Date of Patent: Feb. 14, 2012

(54) LIQUID CRYSTAL DISPLAY DEVICE AND METHOD FOR DRIVING THE SAME

(75) Inventor: Sun Young Choi, Seoul (KR)

(73) Assignee: LG Display Co., Ltd., Seoul (KR)

( * ) Notice: Subject to any disclaimer, the term of this patent is extended or adjusted under 35 U.S.C. 154(b) by 1020 days.

(21) Appl. No.: 11/647,206

(22) Filed: Dec. 29, 2006

(65) Prior Publication Data

US 2008/0001895 A1    Jan. 3, 2008

(30) Foreign Application Priority Data

Jun. 30, 2006  (KR) .................. 10-2006-0060156

(51) Int. Cl.
*G09G 3/36*  (2006.01)
(52) U.S. Cl. ....................................... 345/98
(58) Field of Classification Search .............. 345/98, 345/204; 365/228; 349/149, 152
See application file for complete search history.

(56) References Cited

U.S. PATENT DOCUMENTS

| | | | | |
|---|---|---|---|---|
| 2002/0158859 | A1* | 10/2002 | Nakano et al. ............... | 345/204 |
| 2004/0263758 | A1* | 12/2004 | Lee et al. .................... | 349/150 |
| 2005/0285836 | A1* | 12/2005 | Hwang et al. ............... | 345/93 |
| 2006/0012743 | A1* | 1/2006 | Yun et al. .................... | 349/149 |
| 2006/0028419 | A1* | 2/2006 | Lee et al. .................... | 345/98 |
| 2006/0260977 | A1* | 11/2006 | Lee et al. .................... | 206/709 |

* cited by examiner

*Primary Examiner* — Amr Awad
*Assistant Examiner* — Stephen Bray
(74) *Attorney, Agent, or Firm* — Birch, Stewart, Kolasch & Birch, LLP

(57) ABSTRACT

A liquid crystal display device including a liquid crystal panel, a first printed circuit board attached to one side of the liquid crystal panel and including a mounted drive circuit configured to drive the liquid crystal display panel, a second printed circuit board including a mounted timing controller configured to supply a predetermined control signal and a predetermined data signal to the drive circuit and a mounted power supplying section configured to supply a predetermined voltage to the drive circuit, a flexible circuit board configured to supply the predetermined control signal, the predetermined data signal, and the predetermined voltage supplied from the second printed circuit board to the first printed circuit board, and a memory device mounted to the second printed circuit board. Further, the memory device is configured to perform a write protection function in response to a predetermined voltage supplied from an electrical passage via at least one of the flexible circuit board and the first printed circuit board.

18 Claims, 4 Drawing Sheets

LIQUID CRYSTAL DISPLAY DEVICE AND METHOD FOR DRIVING THE SAME

CROSS-REFERENCE TO RELATED APPLICATIONS

This application claims the benefit of Korean Patent Application No. 10-2006-0060156, filed on Jun. 30, 2006, in the Korean Intellectual Property Office, the disclosure of which is incorporated herein by reference.

BACKGROUND

1. Field of the Invention

The present invention relates to a liquid crystal display device, and more particularly to a liquid crystal display device and corresponding driving method that stably performs a write protection function.

2. Discussion of Related Art

Flat panel display devices such as an LCD (Liquid Crystal Display) device, a PDP (Plasma Display Panel), and an ELD (Electro Luminescent Display) are used as display devices in various equipment. The LCD device is most widely used as a portable image display device due to its excellent image quality, its light weight, its slimness, and its low power consumption, and has replaced a cathode ray tube. The LCD device is also being developed as a television monitor, notebook computer monitor, etc.

Further, the LCD device displays an image using the optical anisotropy and the polarity of a liquid crystal. That is, the liquid crystal molecules included in the liquid crystal can be arranged in a predetermined (constant) direction, and the direction of the liquid crystal molecule arrangement can be controlled by applying an electric field to the liquid crystal. Therefore, when the molecule arrangement direction of the liquid crystal is arbitrary, the molecule arrangement can be changed by applying an electric field. In addition, image information can be expressed by changing the polarization of light in the molecule arrangement direction of the liquid crystal using the optical anisotropy.

In more detail, FIG. 1 is a block diagram of an LCD device including a related art overdriving circuit. Referring to FIG. 1, the related LCD device includes a liquid crystal panel 2, a gate driver 4 and a data driver 6 driving the liquid crystal panel 2, and a timing controller 8 controlling the gate driver 4 and the data driver 6. Further, the liquid crystal panel 2 includes a plurality of gate lines GL1 to GLn and a plurality of data lines DL1 to DLm crossing the plurality of gate lines GL1 to GLn. The data driver 6 is mounted onto a data printed circuit board (PCB) 18.

In addition, the timing controller 8 includes an overdriving circuit (ODC) 10. The ODC 10 corrects video data for an overdrive operation. That is, the ODC 10 compares the previous frame data supplied form a system (not shown) with the current frame data and detects the difference between the data. The ODC 10 corrects the current frame data according to the difference between the previous and current frame data and supplies the corrected data to the data driver 6.

Also, to calculate the corrected data, the ODC 10 reads a look-up table stored in an external memory device, i.e. the EEPROM 12. In the look-up table, the logic values of the data of the previous and current frames are arranged in the X-axis and the Y-axis, and the correction data for the overdrive operation are disposed at portions at which the X-axis and the Y-axis cross each other. Accordingly, the ODC 10 supplies the previous and current frame data to the EEPROM 12 as a column and row address and reads the correction data from the look-up table of the EEPROM 12. In addition, to read the correction data from the look-up table, the ODC 10 communicates with the EEPROM 112 in the I2C method. That is, in the I2C method, two active wire SCL (Clock) and SDA (Data) (not shown) are connected between the ODC drive section 10 and the EEPROM 12.

Further, as shown in FIG. 1, a voltage generating section 14 supplying a predetermined voltage to the write protection terminal W/P of the EEPROM 12 is mounted to a control PCB 22 together with the timing controller 8 and the EEPROM 12. Also, the control PCB 22 is electrically connected to the data PCB 18 through an FFC (Flexible Flat Cable) 20. In addition, when the EEPROM 12 performs the read function, the ODC 10 in the timing controller 8 reads the correction data from the look-up table in the EEPROM 12 and supplies the correction data to the data driver 6. The data driver 6 then supplies the data voltage corresponding to the correction data to the liquid crystal panel 2 to display an image on the liquid crystal panel 2.

In the LCD device, the correction data are frequently changed according to the characteristics of a user and the sale strategy of a manufacturer. In addition, to conveniently change the correction data, the LCD device uses a recordable and nonvolatile EEPROM 12 as an external memory device. Further, the EEPROM 12 has an input voltage terminal receiving an input voltage Vcc from a predetermined power source supply section (not shown), a write protection terminal W/P, and an SCL (Serial Clock) terminal and an SDA (Serial Address/Data) terminal as I2C terminals for communicating with the ODC 10.

In addition, the function of the EEPROM 12 is determined according to the level of a voltage supplied to the write protection terminal W/P. If a high level voltage is supplied to the write protection terminal W/P, the EEPROM 12 performs only a read function. Meanwhile, if a low level voltage is supplied to the write protection terminal W/P, the EEPROM 12 performs both the read function and a write function.

Further, a voltage generated from the voltage generating section 14 is supplied to the write protection terminal W/P of the EEPROM 12. Also, the voltage generating section 14 divides the power source voltage supplied from the power source supply section by the first and second resistors R1 and R2 (as shown in FIG. 1). The voltage divided by the voltage generating section 14 is supplied to the write protection terminal W/P of the EEPROM 12.

Further, to easily regulate the divided voltage output from the voltage generating section 14 to a high level or a low level, one of the first and second resistors R1 and R2 can be replaced by a variable resistor. Thus, by regulating the resistance value of the variable resistor, the divided voltage output from the voltage generating section 14 can be varied to a high level or a low level.

In addition, before the LCD device is completed as a finished product, the EEPROM 12 should be able to perform the read/write functions so as to store the look-up table from an external writing apparatus. On the other hand, when the LCD device is driven (i.e., after the LCD device is finished), the EEPROM 12 should maintain the write protection state to perform only the read function.

Further, the control of the write protection depends on the voltage supplied to the write protection terminal W/P of the EEPROM 12 (i.e., the voltage divided by the first and second resistors R1 and R2). In other words, the function of the EEPROM 12 is changed (i.e., the write protection is selected) by the power source voltage Vdd determining the voltage to be supplied to the EEPROM 12 and the resistance values of the first and second resistors R1 and R2.

However, the power source voltage Vdd can be distorted by noise and static electricity ESD introduced from the outside. If the distorted power source voltage Vdd is supplied to the voltage generating section 14, the voltage generating section 14 divides the distorted power source voltage Vdd using the first and second resistors R1 and R2. Then, the divided voltage is supplied to the write protection terminal W/P of the EEPROM 12 and causes a malfunction of the EEPROM 12 (i.e., releases the write protection function).

More particularly, if a low level voltage is supplied to the write protection terminal W/P of the EEPROM 12, the write protection function of the EEPROM 12 is released. Then, if the EEPROM 12 performs the write operation, the correction data in the look-up table which has been stored in advance is damaged by the static electricity generated from the outside and the noise.

As mentioned above, because the voltage supplied to the write protection terminal W/P is influenced by the distorted power source voltage Vdd, the write protection function of the EEPROM 12 is influenced by the distortion of the voltage supplied to the write protection terminal W/P. Further, when a voltage of a high level is supplied to the write protection terminal W/P to allow the EEPROM 12 to perform only the read function (when the LCD device is driven), a voltage of a low level is occasionally supplied to the write protection terminal W/P of the EEPROM 12 by the distorted power source voltage Vdd so as to allow the EEPROM 12 to perform the write function. If the EEPROM 12 performs the write function when the LCD device is driven, unintended new data is introduced by an external factor, thereby damaging the data stored in the EEPROM 12.

SUMMARY OF THE INVENTION

Accordingly, one object of the present invention is to provide an LCD device that substantially obviates one or more of the problems due to limitations and disadvantages of the related art, and a method for driving the same.

Another object of the present invention to provide an LCD device and corresponding driving method that stably performs a write protection function.

To achieve these and other advantages and in accordance with the purpose of the present invention, as embodied and broadly described herein, the present invention provides a liquid crystal display device including a liquid crystal panel, a first printed circuit board attached to one side of the liquid crystal panel and including a mounted drive circuit configured to drive the liquid crystal display panel, a second printed circuit board including a mounted timing controller configured to supply a predetermined control signal and a predetermined data signal to the drive circuit and a mounted power supplying section configured to supply a predetermined voltage to the drive circuit, a flexible circuit board configured to supply the predetermined control signal, the predetermined data signal, and the predetermined voltage supplied from the second printed circuit board to the first printed circuit board, and a memory device mounted to the second printed circuit board. Further, the memory device is configured to perform a write protection function in response to a predetermined voltage supplied from an electrical passage via at least one of the flexible circuit board and the first printed circuit board. The present invention also provides a corresponding method of driving the liquid crystal panel device.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

DETAILED DESCRIPTION OF PREFERRED EMBODIMENTS

Hereinafter, preferred embodiments according to the present invention will be described with reference to the accompanying drawings.

Figure 1:
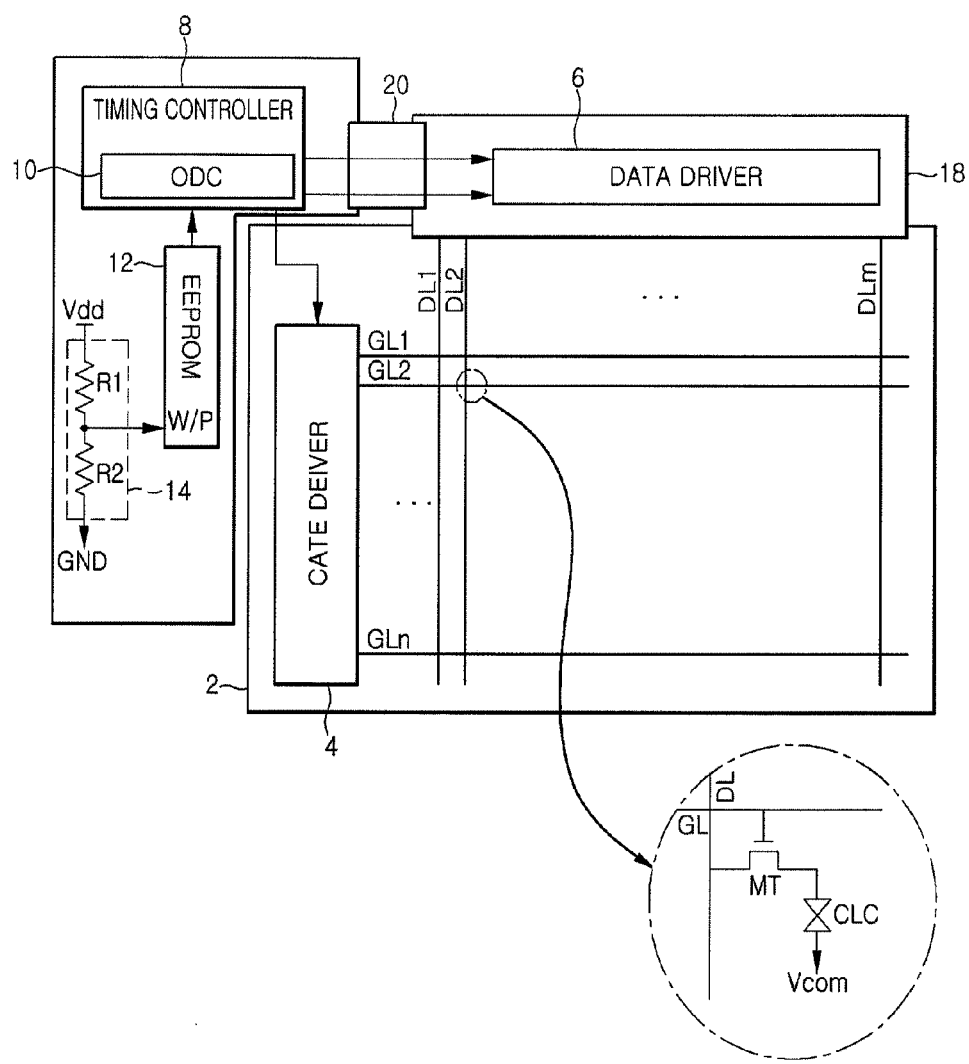
FIG. 1 is a block diagram of an LCD device including a related art overdriving circuit.
Figure 2:
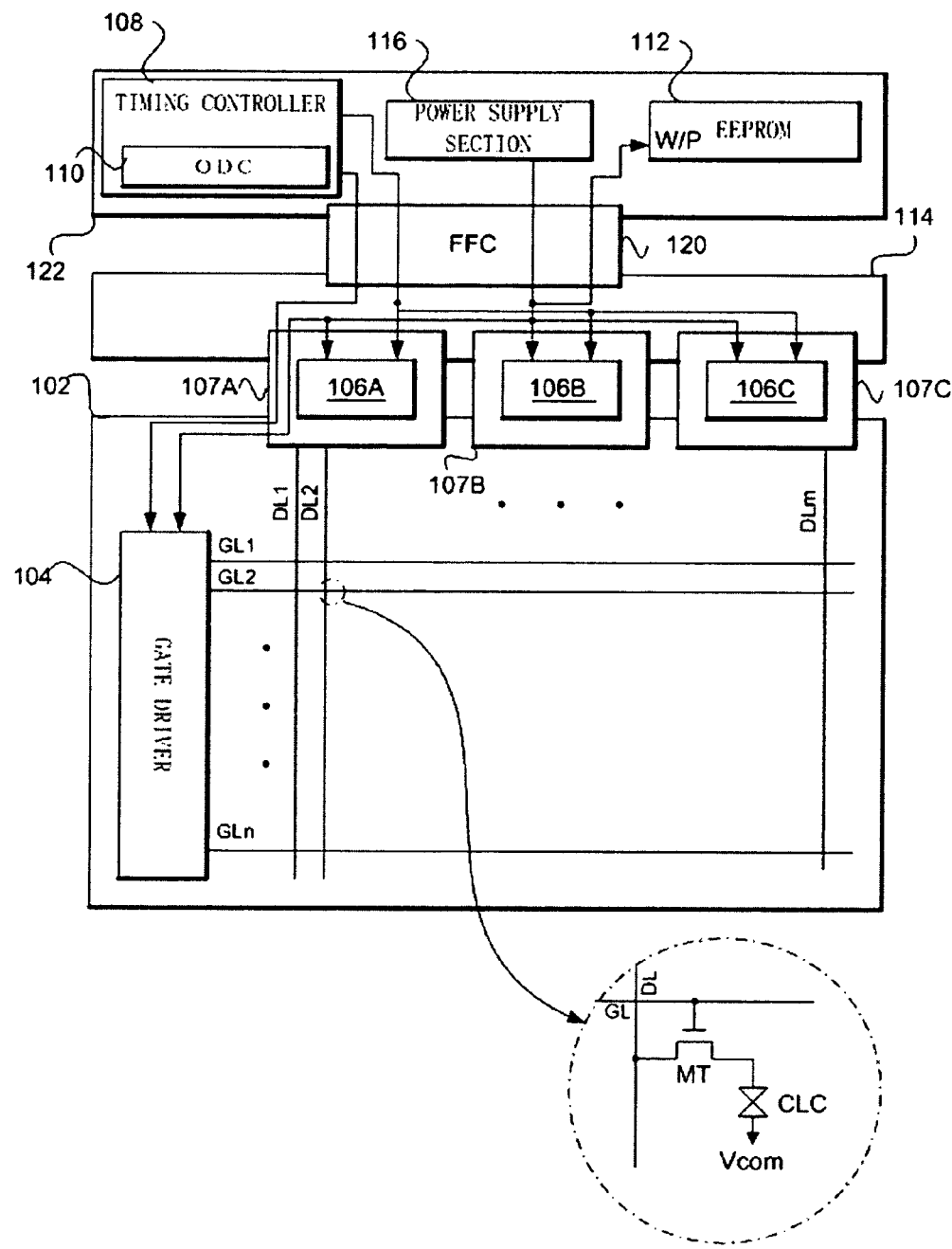
FIG. 2 is a block diagram of an LCD device according to a preferred embodiment of the present invention.

Turning first to FIG. 2, which is a block diagram of an LCD device according to a preferred embodiment of the present invention. As shown in FIG. 2, the LCD device includes a liquid crystal panel 102 displaying an image and a drive section for driving the liquid crystal panel 102. Also included is a plurality of gate lines GL1 to GLn and a plurality of data lines DL1 to DLm arranged in the liquid crystal panel 102 so they cross each other.

Further, in each pixel region defined by the gate lines GL1 to GLn and the data lines DL1 to DLm, a thin film transistor TFT and a liquid crystal cell CLD connected to the transistor TFT are formed. The thin film transistor TFT is connected to the corresponding gate line GL1 to GLn and is turned on and off by a gate scan signal supplied to the gate line GL1 to GLn. Namely, if a gate high voltage VGH is supplied to the gate line GL1 to GLn, the corresponding thin film transistor TFT is turned on. On the other hand, if a low voltage VGL is supplied to the gate line GL1 to GLn, the corresponding thin film transistor TFT is turned off.

The driving section includes a gate driver 104 for driving the plurality of gate lines GL1 to GLn, a plurality of data drive IC chips 106A-106C for driving the plurality of data lines DL1 to DLm, and a timing controller 108 controlling the gate driver 104 and the plurality of data drive IC chips 106A-106C. Further, the gate driver 104 sequentially supplies gate scan signals to the plurality of gate lines GL1 to GLn in response to gate control signals supplied from the timing controller 108. The plurality of data drive IC chips 106A-106C allows data voltages corresponding to the pixel data of one line from the timing controller 108 to be supplied to the plurality of data lines DL1 to DLm in response to the data control signals supplied from the timing controller 108.

Further, the plurality of data drive IC chips 106A-106C are mounted to a plurality of data TCPs 107A-107C. The TCPs 107A-107C to which the data driver IC chips 106A-106C are mounted is commonly connected to a data PCB 114 and the liquid crystal panel 102. Accordingly, the data drive IC chips 106A-106C are connected between the data lines DL1 to DLm on the data PCB 114 and the liquid crystal panel 102 by the data TCPs 107A-107C. In addition, the timing controller 108 generates a gate control signal and a data control signal using a vertical/horizontal synchronous signal Vsync/Hsync, a data enable (DE) signal, and a predetermined clock signal CLK supplied form a system (not shown).

Further, the driving section further includes a power supply section 116 supplying predetermined voltages including a drive voltage to the gate driver 104 and the data driver ICs 106A-106C and an EEPROM 112 storing at least one look-up table. As shown, the timing controller 108, the power source supply section 116, and the EEPROM 112 are mounted onto a control PCB 122 and the plurality of data driver ICs 106A-106C are mounted onto a data PCB 114. Also, the control PCB 122 and the data PCB 114 are electrically connected to each other through a FFC (Flexible Flat Cable) 120.

In addition, the timing controller 108 further includes an ODC 110 for an overdriving drive operation of the LCD device. The ODC 110 is provided in the interior of the timing controller 108 and corrects video data for an overdrive operation. Further, the ODC 110 compares the previous frame data supplied from a system (not shown) with the current frame data and detects the difference between the data. Then, the ODC 110 corrects the current frame data according to the difference between the previous and current frame data and supplies the corrected data to the data drive IC chips 106A-106C.

In addition, to calculate the corrected data, the ODC 110 reads the look-up table stored in an external memory device, i.e. the EEPROM 112. In the look-up table, the logic values of the data of the previous and current frames are arranged in the X-axis and the Y-axis, and the correction data for the overdrive operation are disposed at portions at which the X-axis and the Y-axis cross each other.

Accordingly, the ODC 110 supplies the previous and current frame data to the EEPROM 12 as column and row addresses and reads the correction data from the look-up table of the EEPROM 12. Further, to read the correction data from the look-up table, the ODC 110 communicates with the EEPROM 112 in the I2C method. In the I2C method, two active wire SCL (Clock) and SDA (Data) (not shown) are connected between the ODC drive section 110 and the EEPROM 112.

In addition, the power supply section 116 generates a power source voltage Vdd and a gate high voltage VGH and a gate low voltage VGL which are to be supplied to the gate drive 104. Further, the power source supply section 116 generates a drive voltage Vcc obtained by raising or lowering the power source voltage Vdd. In addition, the drive voltage Vcc is supplied to the plurality of data drive IC chips 106A-106C and the gate driver 104.

The predetermined voltages including the drive voltage generated in the power source supply section 116 are supplied to the gate driver 104 and the plurality of data drive IC chips 106A-106C through pads formed on the FFC 120 via the data PCB 114 similarly to the gate and data control signals. The drive voltage Vcc generated in the power source supply section 116 is a stable voltage which is not distorted by noise, etc. and that has a constant level of approximately 3.3 V. As shown in FIG. 2, one side surface of the FFC 120 is attached to the control PCB 122 and the other side surface is attached to the data PCB 114 to electrically connect the control PCB 122 and the data PCB 114.

Figure 3A:
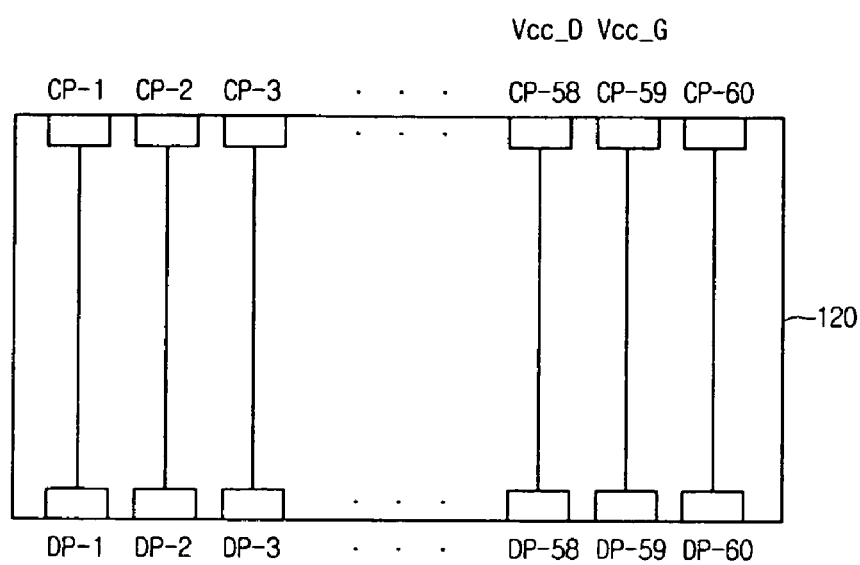
FIG. 3A is an overview illustrating an FFC according to a preferred embodiment of the present invention.

In addition, as shown in FIG. 3A, a plurality of pads are formed in the FFC 120. In more detail, a plurality of control pads CP-1 to CP-60 are formed on one surface of the FFC 120 (i.e., in a first region attached to the control PCB 122). Further, a plurality of data pad DP-1 to DP-60 are formed on the other side surface of the FFC 120 (i.e., in a second region attached to the data PCB 114). Also, as shown, the control pads CP-1 to CP-60 and the data pads DP-1 to DP-60 formed in the FFC 120 are electrically connected to each other in a one to one correspondence. Thus, a control signal supplied from the control PCB 122, a data signal and predetermined voltages including an input voltage Vcc are supplied to the data PCB 114 through the control pads CP-1 to CP-60 and the data pads DP-1 to DP-60 formed on the FFC 120.

As an example, assume the numbers of the control pads CP-1 to CP-60 and the data pads DP-1 to DP-60 formed on the FFC 120 are sixty, respectively. In this example, a first drive voltage Vcc-D which is to be supplied to the plurality of data driver ICs 106A-106C is supplied to a $58^{th}$ control pad CP-58 from the power source supply section 116. A second drive voltage Vcc-G supplied to the gate driver 14 is supplied to the $59^{th}$ control pad CP-59 from the power source supply section 116.

Further, the first drive voltage Vcc-D from the power source supply section 116 is supplied to the data PCB 114 through the $58^{th}$ data pad DP-58 corresponding to the $58^{th}$ control pad CP-58 via the $58^{th}$ control pad CP-58. The first drive voltage Vcc-D supplied to the data PCB 114 is supplied to the plurality of data drive IC chips 106A-106C. Also, the second drive voltage Vcc-G from the power source supply section 116 is supplied to the gate drive 104 through the $59^{th}$ data pad DP-59 corresponding to the $59^{th}$ control pad CP-59.

In addition, a $60^{th}$ control pad CP-60 and a $60^{th}$ data pad DP-60 corresponding to the $60^{th}$ control pad CP-60 are dummy pads. Further, the $59^{th}$ data pad DP-59 and the $60^{th}$ data pad DP-60 which is a dummy pad are electrically connected to each other. Therefore, the second input voltage Vcc-G supplied to the $59^{th}$ data pad DP-59 is supplied to the $60^{th}$ data pad DP-60, and the second drive voltage Vcc-G supplied to the $60^{th}$ data pad DP-60 is supplied to the $60^{th}$ control pad CP-60 corresponding to the $60^{th}$ data pad DP-60. In addition, the $60^{th}$ control pad CP-60 is connected to a write protection terminal W/P of the EEPROM 112, and the second drive voltage Vcc-G supplied to the $60^{th}$ control pad CP-60 is supplied to the write protection terminal W/P of the EEPROM 112.

Further, as the second input voltage Vcc-G of a predetermined level is supplied to the write protection terminal W/P of the EEPROM 112, the state of the write protection terminal W/P is converted to a high state to allow the EEPROM 112 to perform only a read function. Then, when the input voltage Vcc generated in the power source supply section 116 is directly supplied to the write protection terminal W/P of the EEPROM 112, and if the LCD device is turned on, the EEPROM 112 performs only the read function.

Figure 3B:
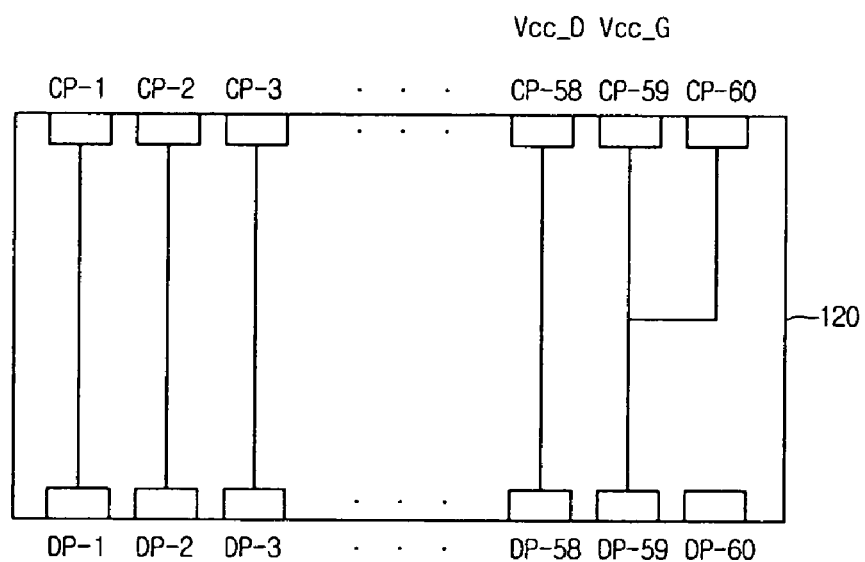
FIG. 3B is another overview illustrating an FFC according to a preferred embodiment of the present invention.

Next, FIG. 3B is an overview illustrating another preferred embodiment of the FFC 120. As shown in FIG. 3B, a plurality of pads are formed on the FFC 120. In more detail, a plurality of control pads CP-1 to CP-60 are formed on one side surface of the FFC 120 (i.e., in a first region attached to the control PCB 122), and a plurality of data pads DP-1 to DP-60 are formed on the other side of the FFC 120 (i.e., in a second region attached to the data PCB 114).

Further, the second drive voltage generated in the power source supply section 116 (FIG. 2) is supplied to the $59^{th}$ control pad CP-59 formed in the FFC 120 and the second drive voltage Vcc-G supplied to the $59^{th}$ control pad CP-59 is supplied to the $59^{th}$ data pad DP-59 corresponding to the $59^{th}$ control pad CP-59. Also, the second drive voltage Vcc-G supplied to the $59^{th}$ data pad DP-59 is supplied to the gate driver 104 (FIG. 2).

Further, the 59$^{th}$ control pad CP-59 is electrically connected to the 60$^{th}$ control pad CP-60, the second drive voltage Vcc-G supplied to the 59$^{th}$ control pad CP-60 is supplied to the write protection terminal W/P of the EEPROM 112 through the 60$^{th}$ control pad CP-60. As the second drive voltage Vcc-G of a predetermined level is supplied to the write protection terminal W/P of the EEPROM 112, the state of the write protection terminal W/P is converted to a high state to allow the EEPROM 112 to perform only the read function. Accordingly, the second input voltage Vcc-G can be supplied to the write protection terminal W/P of the EEPROM 112 in the interior of the FFC 120.

Figure 4:
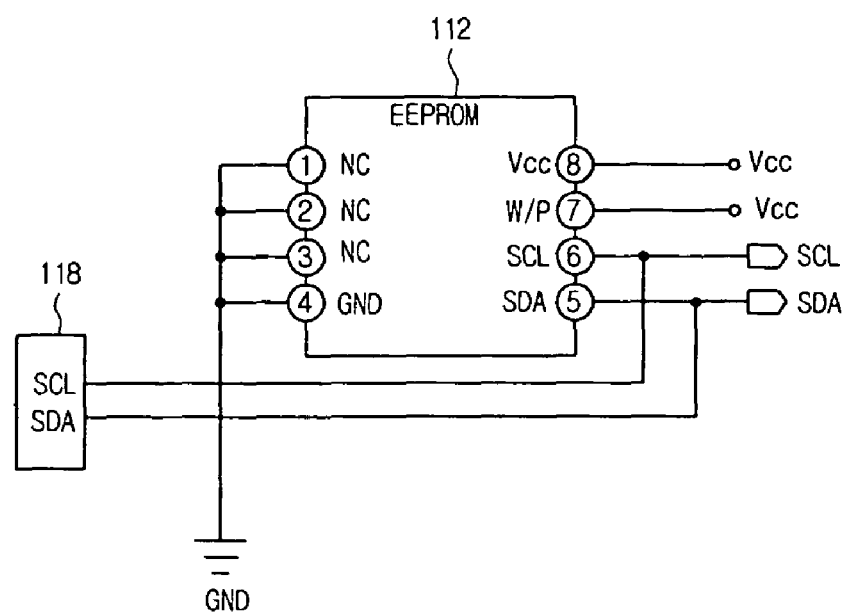
FIG. 4 is an overview illustrating an EEPROM shown in FIG. 2.

Next, FIG. 4 is an overview illustrating the EEPROM 112. As shown, the EEPROM 112 includes first to eighth terminals. The first to third terminals NC are extra null connections and specific data or a drive voltage Vcc is not applied to the first to third terminals. Further, the first to third terminals NC are connected to the ground voltage GND together with the fourth terminal GND which is the ground terminal. Also, the first to third null connections NC can be used when another terminal to which a drive voltage, data, or clock signals are applied is incapable. In addition, the first to third terminals NC are grounded before they are used instead of another terminal regardless of writing and driving the LCD device.

During the writing operation (before engaging the LCD device), the fifth and sixth terminals SDA and SCL receive data SDA and clock signals SCL through a connector 118 from an external writing apparatus (not shown). The fifth and sixth terminals SDA and SCL allow the correction data on the look-up table of the EEPROM 112 to be supplied to the ODC 110 by communicating with the ODC 110 in the I2C method during the driving operation of the LCD device (after engaging the LCD device).

Further, the seventh terminal is a write protection terminal W/P and determines the function of the EEPROM 112. If the high level drive voltage Vcc is supplied to the write protection terminal W/P through the FFC 120, the EEPROM 112 performs the read function. Further, after the LCD device is sold as a finished product, if the LCD device is driven, the drive voltage Vcc is supplied from the FFC 120 to the write protection terminal W/P. Then, the voltage on the write protection terminal W/P maintains a high state. Therefore, the EEPROM 112 can protect the stored correction data on the look-up table from noise or a static electricity input from the outside by performing only the read function.

In addition, the EEPROM 112 stores required controlling data including the look-up table for an overdrive by performing the write function by an external writing apparatus (not shown) in a process before the LCD device is finished. On the other hand, after the LCD device is finished, the drive voltage Vcc from the power source supply section 116 via the FFC 120 is continuously supplied to the write protection terminal WP of the EEPROM 112 to allow the EEPROM 112 to perform only the read function.

In the LCD according to the present invention, the drive voltage Vcc is continuously supplied to the write protection terminal W/P of the EEPROM 112 to maintain the write protection terminal W/P in a high state. Accordingly, the EEPROM 112 continuously performs the write protection function. Further, because the EEPROM 112 continuously performs the write protection function even when static electricity and noise are generated from the outside, the EEPROM 112 performs only the read function and the data stored in the EEPROM 112 is not damaged.

More particularly, because the drive voltage Vcc is uniformly supplied to the write protection terminal W/P of the EEPROM 112 even when static electricity ESD and noise from the outside or malfunction during use of a computer is generated, the data of the EEPROM 112 is not changed to abnormal data. Namely, because the EEPROM 112 performs only the read function by supplying the input voltage of a predetermined level to the write protection terminal W/P, the writing of abnormal data is not generated.

As mentioned above, the LCD device according to the present invention allows the write protection terminal to maintain a high level by supplying the input voltage Vcc continuously maintaining a predetermined level to the write protection terminal of the EEPROM and allows the EEPROM to stably perform the read function, thereby preventing the problem of the related art LCD device. Further, the LCD device according to the present invention reduces an additional cost due to an external circuit and secures an effective area by supplying the input voltage Vcc of a predetermined level which has passed through the FFC to the write protection terminal W/P of the EEPROM without an external circuit differently form the related art LCD device including an external circuit for distribute the power source voltage Vdd and supplying the distributed power source voltage Vdd to the write protection terminal W/P.

Although preferred embodiments of the present invention have been shown and described, it would be appreciated by those skilled in the art that changes might be made in those embodiments without departing from the principles and spirit of the invention, the scope of which is defined in the claims and their equivalents.

What is claimed is:
1. A liquid crystal display device comprising:
a liquid crystal panel;
a first printed circuit board attached to one side of the liquid crystal panel and including a mounted drive circuit configured to drive the liquid crystal display panel;
a second printed circuit board including a mounted timing controller configured to supply a predetermined control signal and a predetermined data signal to the drive circuit and a mounted power supplying section configured to supply a predetermined voltage to the drive circuit;
a flexible circuit board configured to supply the predetermined control signal, the predetermined data signal, and the predetermined voltage supplied from the second printed circuit board to the first printed circuit board; and
a memory device mounted to the second printed circuit board,
wherein the flexible circuit board includes a plurality of pads having a plurality of control pads and a plurality of data pads, the plurality of control pads and data pads are electrically connected to each other in a one to one correspondence,
wherein the memory device includes a write protection element to perform a write protection function in response to a predetermined voltage supplied from an electrical passage via at least one of the flexible circuit board and the first printed circuit board,
wherein the plurality of control pads include a dummy control pad, the plurality of data pads include a dummy data pad,
wherein the write protection element of the memory device is connected to the dummy control pad, the predetermined voltage is supplied to the write protection element through the connected dummy control pad,
wherein the dummy control pad is formed next to a last control pad of the plurality of control pads, and the dummy data pad is formed next to a last data pad of the plurality of data pads, wherein the dummy control pad is connected to the last control pad of the plurality of control pads, wherein the dummy control pad and the dummy data pad are formed on the same surface of the flexible circuit board, and wherein the memory device performs a read function by the predetermined voltage provided from the dummy control pad connected to the write protection element of the memory device.

2. The liquid crystal display device according to claim 1, wherein the electrical passage is formed so that the predetermined voltage can return to the first printed circuit board.

3. The liquid crystal display device according to claim 1, wherein the dummy control pad is connected to the last control pad of the plurality of control pads and the write protection element of the memory, the last control pad is connected to a last data pad of the plurality of data pads, and the predetermined voltage supplied to the last control pad is supplied to the dummy control pad, wherein the predetermined voltage at the dummy control pad is supplied to the write protection element of the memory.

4. The liquid crystal display device according to claim 1, wherein the electrical passage is formed so that the predetermined voltage can return to the flexible circuit board.

5. The liquid crystal display device according to claim 1, wherein the memory device includes a nonvolatile memory device.

6. The liquid crystal display device according to claim 5, wherein the memory device includes an EEPROM.

7. The liquid crystal display device according to claim 1, wherein the timing controller reads the memory device by communicating with the memory device in an I2C method.

8. A method for driving a liquid crystal display device including a liquid crystal panel, a first printed circuit board attached to one side of the liquid crystal panel and including a mounted drive circuit configured to drive the liquid crystal display panel, a second printed circuit board including a mounted timing controller configured to supply a predetermined control signal and a predetermined data signal to the drive circuit and a mounted power supplying section configured to supply a predetermined voltage to the drive circuit, a flexible circuit board supplying the predetermined control signal, the predetermined data signal, and the predetermined voltage supplied from the second printed circuit board to the first printed circuit board, and a memory device mounted to the second printed circuit board, the method comprising:

generating the predetermined voltage by the power supplying section;

circulating the predetermined voltage to at least one of the flexible circuit board and the first printed circuit board; and performing a write protection function by a write protection element of the memory device in response to the circulated predetermined voltage, wherein the flexible circuit board includes a plurality of pads having a plurality of control pads and a plurality of data pads, the plurality of control pads and data pads are electrically connected to each other in a one to one correspondence, wherein the plurality of control pads include a dummy control pad, the plurality of data pads include a dummy data pad, wherein the dummy control pad is formed next to a last control pad of the plurality of control pads, and the dummy data pad is formed next to a last data pad of the plurality of data pads, wherein the dummy control pad is connected to the last control pad of the plurality of control pads, wherein the dummy control pad and the dummy data pad are formed on the same surface of the flexible circuit board, wherein the write protection element of the memory device is connected to the dummy control pad, the predetermined voltage is supplied to the write protection element through the connected dummy control pad, and wherein the memory device performs a read function by the predetermined voltage provided from the dummy control pad connected to the write protection element of the memory device.

9. The method according to claim 8, wherein the voltage circulation step includes returning the predetermined voltage on the first printed circuit board toward the memory device.

10. The method according to claim 8, wherein the voltage circulation step includes returning the predetermined voltage on the flexible circuit board toward the memory device.

11. A method of driving a liquid crystal display device, the method comprising:

driving the liquid crystal panel via a drive circuit mounted on one side of a first printed circuit board attached to one side of the liquid crystal panel;

supplying a predetermined control signal and a predetermined data signal to the drive circuit via a timing controller mounted to a second printed circuit board and supplying a predetermined voltage to the drive circuit via a power supplying section mounted to the second printed circuit board;

supplying the predetermined control signal, the predetermined data signal, and the predetermined voltage supplied from the second printed circuit board to the first printed circuit board via a flexible circuit board; and performing a write protection function via a write protection element of a memory device mounted to the second printed circuit board in response to a predetermined voltage supplied from an electrical passage via at least one of the flexible circuit board and the first printed circuit board, wherein the flexible circuit board includes a plurality of pads having a plurality of control pads and a plurality of data pads, the plurality of control pads and data pads are electrically connected to each other in a one to one correspondence, wherein the plurality of control pads include a dummy control pad, the plurality of data pads include a dummy data pad, wherein the dummy control pad is formed next to a last control pad of the plurality of control pads, and the dummy data pad is formed next to a last data pad of the plurality of data pads, wherein the dummy control pad is connected to the last control pad of the plurality of control pads, wherein the dummy control pad and the dummy data pad are formed on the same surface of the flexible circuit board, wherein the write protection element of the memory device is connected to the dummy control pad, the predetermined voltage is supplied to the write protection element through the connected dummy control pad, and wherein the memory device performs a read function by the predetermined voltage provided from the dummy control pad connected to the write protection element of the memory device.

12. The method according to claim 11, further comprising:
returning the predetermined voltage to the first printed circuit board via the electrical passage.

13. The method according to claim 12, further comprising:
transferring the predetermined voltage from the second printed circuit board to the first printed circuit board via a first wire in the flexible circuit board; and
transferring the predetermined voltage returning from the first printed circuit board to the memory device on the second printed circuit board via a dummy wire in the flexible circuit board.

14. The method according to claim 11, further comprising:
returning the predetermined voltage to the flexible circuit board via the electrical passage.

15. The method according to claim 12, further comprising:
transferring the flexible circuit board includes a first wire configured to transfer the predetermined voltage from the second printed circuit board to the first printed circuit board via a first wire in the flexible circuit board; and
returning the predetermined voltage on the first printed circuit board to the memory device on the second printed circuit board via a dummy wire in the flexible circuit board.

16. The method according to claim 11, wherein the memory device includes a nonvolatile memory device.

17. The method according to claim 16, wherein the memory device includes an EEPROM.

18. The method according to claim 11, wherein the timing controller reads the memory device by communicating with the memory device in an I2C method.

* * * * *